United States Patent [19]

Zollinger

[11] 4,221,629
[45] Sep. 9, 1980

[54] ELECTRON BEAM EVAPORATION DEVICE FOR VACUUM EVAPORATORS

[75] Inventor: Erich Zollinger, Schaanwald, Liechtenstein

[73] Assignee: Balzers Aktiengesellchaft, Liechtenstein

[21] Appl. No.: 961,544

[22] Filed: Nov. 17, 1978

[30] Foreign Application Priority Data

Nov. 22, 1977 [CH] Switzerland ............... 014235/77

[51] Int. Cl.² .............................................. B01D 1/00
[52] U.S. Cl. .......................... 159/28 R; 159/DIG. 26; 159/29; 13/31 EB
[58] Field of Search .............. 159/DIG. 1, DIG. 26, 159/24 R, 28 R, 29 R; 156/610, 614; 13/31, 31 EB; 282/234

[56] References Cited

U.S. PATENT DOCUMENTS 3,277,865  10/1966  Smith, Jr. ................................. 13/31
3,582,529  6/1971  Anderson et al. ....................... 13/31

Primary Examiner—Norman Yudkoff
Attorney, Agent, or Firm—McGlew and Tuttle

[57] ABSTRACT

An electron beam evaporation device for vacuum evaporators, comprises, a supporting bar and a retainer for the material to be evaporated, an electron beam source and a deflecting magnet for directing the electron beam onto the material to be evaporated or mounted on said supporting bar. At least two of the elements are mounted on the bar so as to be displaceable thereon. Preferably, the retainer for the material to be evaporated is provided on one end of the bar and the electron beam source and the deflecting magnet are displaceable along the bar.

5 Claims, 2 Drawing Figures

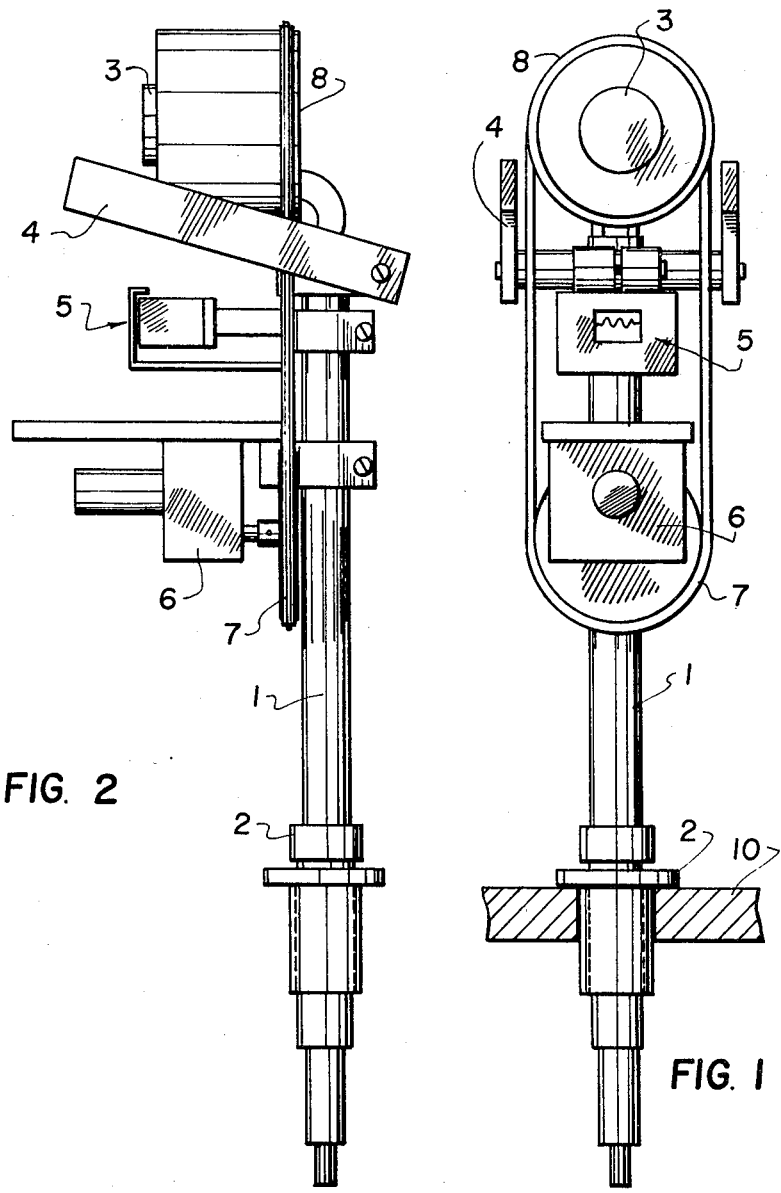

ELECTRON BEAM EVAPORATION DEVICE FOR VACUUM EVAPORATORS

FIELD AND BACKGROUND OF THE INVENTION

The present invention relates to evaporation devices in general and, in particular, to a new and useful electron beam evaporation device for vacuum evaporators which comprises a retainer for the material to be evaporated, an electron beam source and a deflecting magnet for directing the electron beam onto the material to be evaporated.

DESCRIPTION OF THE PRIOR ART

Devices in which the elements of an electron beam evaporator are combined to a unit are known in a number of different variations. The majority of these devices have the disadvantage that they can only be used for specific applications or in evaporators of a specific nature. That is, all of the different applications require a specific geometry of the arrangement of the electron beam source, the magnet, and the receiver for the material to be evaporated, in order to obtain an optimum efficiency.

SUMMARY OF THE INVENTION

The present invention is directed to an electron beam evaporation device which ensures broad possibilities of application, thus meeting the requirements of most of the various specific cases of use. The adaptation to a specific application is to be made possible in a quick and simple manner thus avoiding the necessity of exchanging the entire device. This is obtained, in accordance with the invention, by providing that the three principal constructional elements are secured to a supporting bar and that at least two of these elements are displaceable thereon.

This ensures the necessary adaptability to the specific applications in a surprisingly simple manner. Experience has shown that, in most cases, it is even sufficient to fix the retainer for the material to be evaporated to one end of the supporting bar and to make only the electron beam source and the deflecting magnet displaceable on the bar. It is advisable to provide the supporting bar with cooling channels and with a flange for securing it to the wall of the container.

A particular advantage of the inventive electron beam evaporation device is that the focal spot of the electron beam on the material to be evaporated can be easily enlarged or reduced as desired by adjusting the position of the deflecting magnet, which means that the device can be adapted to the particular requirements of the evaporative material. With an evaporation of mixtures or alloys, it may be advantageous to provide a retainer for the material to be evaporated, which is rotatable about a vertical axis.

Accordingly, it is an object of the invention to provide an electron beam evaporation device for vacuum evaporators, which comprises a supporting bar with a retainer for material to be evaporated, an electron beam source and a deflecting magnet for directing the electron beam onto the material to be evaporated or mounted on the bar and with at least two of these elements being displaceable along the bar.

A further object of the invention is to provide an electron beam evaporation device for vacuum evaporators which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

BRIEF DESCRIPTION OF THE DRAWING

In the Drawing:

FIG. 1 is a top plan view of an electron beam evaporation device for vacuum evaporators constructed in accordance with the invention; and FIG. 2 is a side elevational view of the electron beam evaporation device shown in FIG. 1.

DESCRIPTION OF THE PREFERRED EMBODIMENT

Referring to the drawing in particular, the invention embodied therein, comprises, an electron beam evaporation device, particularly for vacuum evaporators, which includes a supporting bar having means, such as a flange 2 thereon, for mounting the bar on a wall 10 of a container.

Both of the Figures of the drawing show a supporting bar 1 which can be hermetically secured to the wall of a container (not shown) by means of a flange 2 through which it extends to the outside. The supporting bar is hollow so that it may accommodate all necessary lines for supplying the electron beam source with electric current and high voltage, as well as any supply and return lines for a coolant if a cooled receiver for the evaporative material is provided.

In the embodiment shown, the supporting bar carries, in sequential order: a water-cooled, double-walled copper crucible or receiver 3 as the retainer for the material to be evaporated, a deflecting magnet 4 which in this example comprises a permanent magnet of a shape similar to a horseshoe magnet, having two pole pieces, and an electron beam source 5, which may be of a kind known per se.

In the present embodiment, only the electron beam source 5 and the deflecting magnet 4 are displaceable on the supporting bar, while the receiver 3 is fixedly secured to the bar.

In order to make the device more adaptable, however, it is possible to make the receiver 3 displaceable on the supporting bar also. It is further advantageous to make the crucible 3 rotatable. For this purpose, in the embodiment shown, a motor 6 is mounted on the supporting bar 1 in addition. The crucible 3 is rotated by a chain 7 which is driven by the motor 6 and engages a toothed rim provided on the circumference of the crucible. For this purpose, the crucible 3 is advantageously supported on a rotatable base (not shown) which is connected to the supporting bar 1.

In FIGS. 1 and 2, the supporting bar 1 is shown as a straight rod which would be secured to and extend through the side wall of a container wall 10 in a horizontal position. To make it possible to secure it, if needed, to a wall part which is not vertical, the bar or rod may be correspondingly bent, so that after flanging it to a respective wall, the electron beam evaporator itself again extends in the horizontal direction.

In particular, it may be advisable to bend the supporting bar at a right angle, so that with a horizontal extension of the evaporator, the flanged end of the supporting bar extends vertically and can be passed through the bottom plate of the evaporation chamber. Then, by shifting the bar in the vertical direction, any suitable vertical position of the evaporator may be adjusted, which is of importance particularly in instances of a horizontal evaporation in which the distribution of the deposit on the substrates arranged laterally of the evaporative source depends in a determinative manner on the vertical position of this source.

The inventive electron beam evaporation device may be advantageously applied to a horizontal vapor deposition also, in which case, the supporting bar 1 is passed through the horizontal bottom plate of the evaporator, so that the electron beam source, the deflecting magnet and the receiver for the substance to be evaporated are arranged one above the other, thus, in the sequential position in which the constructional elements are shown in FIGS. 1 and 2. In such a case, of course, the receiver 3 must be designed accordingly, to ensure that the evaporative material is securely retained. With a non-melting, only subliming material, it is sufficient to clamp a block of the material in the receiver.

The material only evaporates from the surface portion hit by the electron beam. With a melting material, the receiver may be designed, as mentioned above and in a manner known per se, as a rotary crucible in which the material is urged to the walls by centrifugal force and is thus prevented from flowing out of the crucible which would be provided with a suitable rim.

While a specific object of the invention has been shown and described in detail to illustrate the application of the principles of the invention, it will be understood that the invention may be embodied otherwise without departing from such principles.

What is claimed is:

1. An electron beam evaporation device for evaporators, comprising, a supporting bar, a retainer for the material to be evaporated mounted on said supporting bar, an electron beam source mounted on said supporting bar and a deflecting magnet for directing the electron beam onto the material to be evaporated mounted on said supporting bar, at least two of said retainer, said deflecting magnet and said electron beam source being displaceable along said supporting bar.

2. An electron beam evaporation device for evaporators, as claimed in claim 1, wherein said retainer is provided on one end of said supporting bar, said electron beam source and said deflecting magnet being displaceable along said supporting bar.

3. An electron beam evaporation device for evaporators, as claimed in claim 1, wherein said retainer is rotatably mounted on said supporting bar.

4. An electron beam evaporation device for evaporators, as claimed in claim 1, wherein said supporting bar is hollow and provided with a flange for securement of said bar to a container wall.

5. An electron beam evaporation device for evaporators, as claimed in claim 4, wherein said supporting bar is shiftable in said flange.

* * * * *